United States Patent [19]
Yoda et al.

[11] 4,015,049
[45] Mar. 29, 1977

[54] METAL COATED UNSATURATED CARBOXYLIC ACID MODIFIED POLYOLEFIN ARTICLE AND METHOD OF MAKING SAME

[75] Inventors: Makoto Yoda, Kawagoe; Kazushige Ishibashi, Ohi; Shozo Wada, Zushi, all of Japan

[73] Assignee: Toa Nenryo Kogyo Kabushiki Kaisha, Tokyo, Japan

[22] Filed: May 5, 1975

[21] Appl. No.: 575,054

[30] Foreign Application Priority Data

May 9, 1974 Japan .............................. 49-50704

[52] U.S. Cl. .................. 428/461; 427/250; 427/383 R; 428/500
[51] Int. Cl.² .................. B05D 3/02; B32B 15/08; C23C 13/02
[58] Field of Search .................. 427/250, 383, 380; 428/461, 500

[56] References Cited

UNITED STATES PATENTS

| | | | |
|---|---|---|---|
| 2,992,125 | 7/1961 | Fustier | 427/250 |
| 3,466,207 | 9/1969 | Vincent et al. | 428/461 |
| 3,480,464 | 11/1969 | Lacy | 427/250 |
| 3,862,265 | 1/1975 | Steinkamp | 260/885 |
| 3,922,421 | 11/1975 | Frank | 428/461 |

*Primary Examiner*—Cameron K. Weiffenbach
*Attorney, Agent, or Firm*—William T. Clarke; John J. Mahon

[57] ABSTRACT

The adhesive strength of a metallic layer prepared by vacuum metallizing on an unsaturated carboxylic acid modified polyolefin article is substantially increased by heating below the melting point of the polyolefin after the metallization. Preferable heating temperature is 92°–157° C. for polypropylene and heating time is 10 sec. – 1 hour. An aluminum layer obtained by this invention has remaining ratio of 100% after cross cut test.

21 Claims, No Drawings

METAL COATED UNSATURATED CARBOXYLIC ACID MODIFIED POLYOLEFIN ARTICLE AND METHOD OF MAKING SAME

FIELD OF THE INVENTION

This invention relates to a method of forming a metallic film on the surface of a polyolefin article and more particularly, it is concerned with a method of providing the surface of a polyolefin article with a strong and non-strippable metallic film by vapor deposition in vacuum.

DESCRIPTION OF THE PRIOR ART

It has hitherto been known to form metallic layers by vapor deposition in vacuum on the surfaces of various synthetic resin articles. However, it is known that this prior art method when applied to the surface of polyolefin articles such as polyethylene and polypropylene results in a very weak adhesive force between the polyolefin substrate and vapor deposited metal film due to the nonpolar properties of polyolefins. Previously, it has been proposed to improve the adhesiveness of vapor deposited metallic films to polyolefin articles by subjecting such a polyolefin article to a pretreatment such as by corona discharge or flame or with a solvent or mixed acid of chromic acid and sulfuric acid prior to vapor deposition in vacuum, but these pretreatments are unsatisfactory. In another method, prior to vapor deposition in vacuum a pretreatment has been attempted which comprises applying a primer or base coat to the surface of the polyolefin article, but this method has also the disadvantage that the adhesive force between polyolefins and primers is deficient and, moreover, the method involves additional processing steps such as primer coating and drying.

It is an object of the invention to provide a method of forming a tenacious and non-strippable metallic film on the surface of a polyolefin.

It is another object of the invention to provide a method whereby an improved adhesive force between a metallic film and polyolefin substrate can be attained without any pretreatment of the polyolefin substrate.

SUMMARY OF THE INVENTION

The present invention provides a method of forming a metallic layer on a polyolefin article containing a polyolefin modified by one or more unsaturated fatty acids or their functional derivatives by vapor deposition in vacuum and then subjecting the composite so formed to a heat treatment at a temperature lower than the melting point of the polyolefin.

A method for the modification of polyolefins by grafting with one or more unsaturated fatty acids or their functional derivatives and the novel polyolefins so formed are disclosed and claimed in U.S. Pat. No. 3,862,265 which is incorporated herein by reference. According to this method modified polyolefins are produced by a controlled reaction in an extruder in which an initiator and monomer or monomers are injected into an extruder containing the base stock under conditions of maximum distribution or intensive mixing.

DETAILED DESCRIPTION OF THE INVENTION

As mentioned above, a method of modifying the polyolefin by one or more unsaturated fatty acids or their functional derivatives is known. The modified polyolefin can be obtained by heating a polyolefin and one or more of unsaturated fatty acids or their functional derivatives in the presence of a radical producing agent. For example, it can be obtained by mixing a polyolefin, unsaturated fatty acid or functional derivative thereof and organic peroxide and subjecting the resulting mixture to melting and, simultaneously, reacting in an extruder at a temperature of at least the melting point of the polyolefin, or by subjecting to solution reaction in a suitable solvent capable of dissolving a polyolefin. The modification using an extruder is preferable.

Examples of the unsaturated fatty acid which can be used in the above described modification reaction are acrylic acid, maleic acid, fumaric acid, itaconic acid, citraconic acid, methacrylic acid, crotonic acid, isocrotonic acid, endo-bicyclo[2,2,1]-5-heptene-2,3-dicarboxylic acid, methyl-endo-bicyclo[2,2,1]-5-heptene-2,3-dicarboxylic acid, cis-4-cyclohexene-1,2-dicarboxylic acid, methyl-ciscyclohexene-1,2-dicarboxylic acid and endo-bicyclo[2,2,1]-1,2,3,4,7,7-hexachloro-2-heptene-5,6-dicarboxylic acid. Examples of the functional derivative thereof are anhydrides, amides and esters of these fatty acids. More preferably, endo-bicyclo[2,2,1]-5-heptene-2,3-dicarboxylic anhydride, maleic anhydride or acrylic acid or mixtures thereof are used.

Preferable examples of the polyhydric alcohol used herein for the preparation of the ester include compounds having at least two alcoholic hydroxy groups such as ethylene glycol, 1,4-butanediol, 1,6-hexanediol, p-hydroquinone, gylcerine and pentaerythritol and, in addition, polyethylene glycols having a molecular weight of 200 to 40000. polyethylene glycols having a molecular weight more than this range do not readily provide the desired modified polymers because of their much lower reaction velocity.

Preferable examples of the polyamine used herein for the preparation of the polyamides include compounds having at least two amino groups such as ethylenediamine, trimethylenediamine, hexamethylenediamine, p-phenylenediamine, benzidine, diethylenetetramine and tetramethylenepentamine and, in addition, polyethyleneamines having a molecular weight of 200 to 40000. Useful examples of the amino alcohol are compounds having at least one amino group and at least one alcoholic hydroxyl group such as ethanolamine, 3-amino-1-propanol, amino phenols and amino cresols. The polyhydric alcohols, polyamines and amino alcohols are not to be interpreted as being limited by these examples.

The reaction and addition quantity of the above described unsaturated fatty acid or its functional derivative is ordinarily in the range of about 0.002 to 3 mol %, preferably, 0.01 to 2 mol % of the polypropylene. If less than 0.002 mol %, the desired adhesiveness is not obtained, while if more than 3 mol % is employed, the adhesiveness is not increased. The modified polyolefin can be used individually or in combination with the same or different non-modified polyolefins. In this latter case, the reaction and addition quantity of the unsaturated fatty acid or its functional derivative can be so determined that the above described molar percent may be satisfied based on the whole polyolefin including the non-modified polyolefin and modified polyolefin. Hereinafter, "modified polyolefin" is defined as including a modified polyolefin alone or a blend of a modified polyolefin and non-modified polyolefin.

If necessary, stabilizers, lubricants, fillers and pigments can be incorporated in the modified polyolefin of the invention according to use thereof. Formation or molding of the modified polyolefin of the invention can be carried out by any of the conventional methods and is not particularly limited. The vacuum vapor deposition of a metal on a formed modified polyolefin can be carried out in conventional manner, but the present invention is characterized by obtaining a metallic layer having a good adhesive strength without any pretreatments.

The present invention has been illustrated using aluminum as an example, but is not to be limited thereby. In addition to aluminum, silver, gold and copper can be used for the vapor deposition.

The adhesive force of a vapor deposited film obtained at this stage is greater than that obtained with vapor deposited films of polyolefins obtained by known methods, for example, corona discharge treatment, flame treatment, solvent treatment or primer coating. The vapor deposited film, therefore, can be sufficiently put to practical use at this stage if overcoated with a resin. Even if not overcoated, the vapor deposited film can also be used depending on the object.

However, the adhesive force of the vapor deposited film is not sufficient for a use which requires an adhesive force such that there is no peeling in a cross cut peel test of cellotape (trade name of cellophane adhesive tape) without overcoating.

The second step of the invention consists in, as mentioned above, heating the modified polyolefin article on which a metallic film has been formed by conventional vapor deposition, at a temperature lower than the melting point of the polyolefin. The adhesive strength of a vapor deposited film on the modified polyolefin article is surprisingly improved by this heating treatment, so that no peeling takes place in a cross cut peel test of cellotape. This result is more surprising, since the adhesiveness of a metallic film obtained in conventional manner on a polyolefin article, for example, after a corona discharge treatment cannot be improved by such a heating treatment.

Any heating temperature can be employed in the present invention if less than the melting point of a polyolefin, but should be as high as possible so as to raise the productivity, since the heating time necessary is increased with lowering of the heating temperature. At a temperature of the melting point of the polyolefin or higher, the polyolefin article of course melts and at a temperature lower than the melting point but near it, the polyolefin article melts with inevitable fluctuation of the heating temperature. Therefore, a temperature of about 5° C or more lower than the melting point but not about 70° C or more lower than the melting point is generally desired. A more preferable heating temperature is about 10° C or more lower than the melting point but not about 50° C or more lower than the melting point, for example, 157° to 92° C, preferably 152° to 112° C for modified isotactic polypropylene.

The heating time depends on the heating temperature and is ordinarily about 10 seconds to about 1 hour within the above described heating temperature range. In the case of isotactic polypropylene, for example, the heating time is about 2 minutes at a heating temperature of about 150° C, about 10 minutes at about 140° C and about 1 hour at about 100° C. The heating method is not limited and can be carried out in a suitable controlled temperature oven or a bell jar of an apparatus for the vapor deposition of a metal.

The adhesive force between a substrate and metallic film is markedly raised by the heating treatment according to the invention, so that no peeling takes place in a cross cut peel test with cellotape.

Therefore, the metal vapor deposited polyolefin article of the invention can be applied to various uses without any overcoat, but it may of course be overcoated as in the prior art, for example, where an overcoat is required for preparation for coloring the vapor deposited surface. Even if overcoated, the adhesive force is not lowered.

PREFERRED EMBODIMENTS

In order to illustrate the present invention in greater detail, the following experiment was carried out in a case where polypropylene (which will hereinafter be referred to as "PP") was selected as a polyolefin, modified with endo-bicyclo[2,2,1]-5-heptene-2,3-dicarboxylic anhydride (called generally "Himic Anhydride") to obtain a Himic Anhydride-modified polypropylene (which will hereinafter be referred to as "HAPP") and then subjected to vapor deposition of aluminum in vacuum to coat with an aluminum film:

1. Sample

HAPP : PP of MFR = 0.6 and an intrinsic viscosity $[\eta] = 2.95$ (measured in decalin at 135° C) was modified in a 100 m/m bent type extruder. This HAPP had 0.05 mol % of Himic Anhydride added and an intrinsic viscosity $[\eta] = 1.20$.

| Sample (1) | |
|---|---|
| HAPP described above | 40 parts |
| PP of MFR = 5 and Intrinsic viscosity = 2.37 | 60 parts |

These materials were blended by extruding and then formed into a sheet of 150 microns in thickness.

| Sample (2) | |
|---|---|
| HAPP described above | 40 parts |
| PP of MFR = 5 described above | 40 parts |
| Talc Powder | 20 parts |

These materials were blended in this proportion by extruding and then formed into a sheet of 150 microns in thickness.

2. Vapor Deposition in Vacuum

The above described Sample Sheets (1) and (2) were respectively subjected in conventional manner to vapor deposition of aluminum in vacuum directly or through a corona discharge treatment. These samples were then subjected to a finger-rubbing test and Cellotape test to examine the peel strength directly or after heating at 140° C for 15 minutes, thus obtaining results as shown in Table 1.

3. Examination of After-heating Condition

The above described Sample Sheets (2) were subjected to vapor deposition in vacuum directly or after a corona discharge treatment, to afterheating at a temperature of 100° to 160° C for various times and to a Cellotape peel test to examine the peel strength and to seek the time required at each temperature.

Results are shown in Table 2.

Table 1

| | | Peel Test | | | |
|---|---|---|---|---|---|
| | | Before Heating | | After Heating | |
| Sample Sheet | Pretreatment | Finger-Rubbing* Test | Cellotape** Test | Finger-Rubbing* Test | Cellotape** Test |
| (1) | No | No Change | 65 | No Change | 100 |
| (1) | Corona Discharge | " | 85 | " | 100 |
| (2) | No | " | 70 | " | 100 |
| (2) | Corona Discharge | " | 85 | " | 100 |
| PP | No | Much Al powder adhered | 0 | Much Al powder adhered | 0 |
| PP | Corona Discharge | A little Al powder adhered | 25 | A little Al powder adhered | 25 |

NOTE:
*The sample was examined, after rubbing the vapor deposited surface with a finger, whether the Al powder adhered to the finger or not. No Change: No Al powder adhered.
**Using a knife, the vapor desposited surface was engraved with 11 parallel lines at an interval of 1 mm in each of vertical and horizontal directions to form a checkered pattern consisting of 100 squares of 1 mm × 1 mm. When a Cellotape was adhered to the engraved surface and then peeled rapidly therefrom, the number of non-peeled squares was counted. Where there were a number of peeled squares, the proportion of the residual area was roughly estimated by percent (cross cut peel test).

Table 2

Examination of After-Heating Condition (Cellotape Peel Test)

| After-Heating Temperature | After-Heating Time | Cellotape Peel Test*** No Pretreatment | Corona Discharge |
|---|---|---|---|
| 160° C | 1 min | Somewhat Peeled | Somewhat Peeled |
| | 2 min | do | do |
| | 5 min | Not Peeled | Not Peeled |
| 150° C | 2 min | Somewhat Peeled | Somewhat Peeled |
| | 5 min | do | Little Peeled |
| | 10 min | Not Peeled | Not Peeled |
| 140° C | 5 min | Somewhat Peeled | Somewhat Peeled |
| | 10 min | Little Peeled | Little Peeled |
| | 15 min | Not Peeled | Not Peeled |
| 120° C | 15 min | Somewhat Peeled | Somewhat Peeled |
| | 30 min | do | Little Peeled |
| | 60 min | Not Peeled | Not Peeled |
| 100° C | 30 min | Somewhat Peeled | Somewhat Peeled |
| | 60 min | do | do |
| | 120 min | Not Peeled | Not Peeled |

NOTE:
***Peeling state when a Cellotape was adhered to the vapor deposited surface and peeled rapidly. "Not Peeled": No adhesion of Al powder to the Cellotape was found.

As is apparent from Table 1, there are no remarkable differences between the cases where the pretreatment by corona discharge is carried out or not, while there are remarkable differences between the cases where PP is modified or not. It is also apparent from Table 2 that the corona discharge treatment of the prior art results in no remarkable effects and that the time required for the heat treatment of the invention depends on the heating temperature.

The following examples are given in order to illustrate the invention in detail without limiting the same.

EXAMPLE 1

1000 parts by weight of isotactic polypropylene pellets having an intrinsic viscosity [η] of 2.95 measured in decalin at 135° C, 10 parts by weight of endo-bicyclo [2,2,1]-5-heptene-2,3-dicarboxylic anhydride and 2 parts by weight of di-tert-butyl peroxide were mixed by means of a Henshel mixer and charged in the hopper of an extruder having a screw diameter of 65 mm, screw L/D of 30 and barrel temperature of 180° to 200° C to obtain modified polypropylene pellets having an intrinsic viscosity [η] of 1.20 measured in decalin at 135° C, in which 0.05 mol % of endo-bicyclo[2,2,1]-5-heptene-2,3-dicarboxylic anhydride was chemically combined.

40 parts by weight of the thus obtained modified polypropylene pellets were mixed with 60 parts by weight of isotactic polypropylene pellets having an intrinsic viscosity [η] of 2.37 and charged into a sheet-making apparatus to obtain a polypropylene sheet having a thickness of 150 microns. A part of the resulting sheet was subjected to vapor deposition in a vacuum vapor deposition apparatus without any pretreatment and an aluminum vapor deposited film of about 0.1 micron in thickness was formed on one side of the sheet. On the other hand, the other part of the same sheet was subjected to a corona discharge pretreatment and then to vapor deposition in vacuum. Both parts of the vapor deposited sheet were heated in a drier kept at 150° C for 10 minutes.

Then these samples were subjected to the following cross cut peel test of cellotape before or after the heating treatment. The vapor deposited film was engraved by a knife to form 11 parallel lines at an interval of 1 mm and other 11 parallel lines crossed vertically to form 100 squares of 1 mm × 1 mm. A cellotape was adhered to the resulting checkered pattern and then peeled rapidly. The adhesive force of the vapor deposited film was assessed by the number of squares not peeled. The results are shown in Table 3.

EXAMPLE 2

The procedure of Example 1 was repeated except using maleic anhydride instead of endo-bicyclo[2,2,1]-5-heptene-2,3-dicarboxylic anhydride used in Example 1, thus obtaining a maleic anhydride-modified polypropylene in which 0.15 mol % of maleic anhydride was chemically combined.

To 20 parts by weight of the thus obtained modified polypropylene were added 60 parts by weight of crystalline polypropylene having an intrinsic viscosity [η] of 1.90 and 20 parts by weight of talc powder and the combination was mixed in an extruder to obtain pellets. A sheet of 1 mm in thickness was formed from the pellets by press forming and, without any pretreatment, was then subjected to vapor decomposition of aluminum in vacuum in conventional manner to form an aluminum layer of 0.07 micron in thickness on one side of the sheet. The sheet thus vapor deposited was then heated in a drier at 140° C for 15 minutes. A peel test similar to that of Example 1 was carried out before and after the heat treatment to obtain the results shown in Table 3.

EXAMPLE 3

1000 parts by weight of low density polyethylene pellets having a density of 0.924 and melt index of 10.0 measured at 190° C under a load of 2.16 Kg, 20 parts by weight of cis-4-cyclohexene-1,2-dicarboxylic anhydride and 2 parts by weight of dicumyl peroxide were mixed by means of a Henshel mixer and subjected to a modification reaction in an extruder similar to that of Example 1 at a barrel temperature of 160° to 180° C to obtain modified polyethylene pellets having a melt index of 2.0, in which 0.05 mol % of cis-4-cyclohexene-1,2-dicarboxylic anhydride was chemically combined.

20 parts by weight of the resulting modified polyethylene pellets and 80 parts by weight of low density polyethylene pellets having a density of 0.926 and melt index of 7.0 were mixed and charged in a film producing apparatus to obtain a polyethylene film having a thickness of 30 microns. The resulting film was then subjected to vapor deposition of aluminum in vacuum in conventional manner, without any pretreatment, to form an aluminum layer of 0.05 micron in thickness on one side of the film and heated in a drier at 90° C for 30 minutes. A peel test similar to that of Example 1 was carried out before or after the heat treatment to obtain the results shown in Table 3.

COMPARATIVE EXAMPLE 1

For comparison, a polypropylene sheet having a thickness of 150 microns was prepared from crystalline polypropylene having an intrinsic viscosity [η] of 1.89 measured in decalin at 135° C by means of a sheet producing apparatus and, directly or after a corona discharge pretreatment, subjected to vapor deposition of aluminum in vacuum in conventional manner to obtain an aluminum layer having a thickness of about 0.1 micron. The sheet thus vapor deposited was heated in a drier kept at 150° C for 5 minutes. A peel test similar to that of Example 1 was carried out as to the samples before and after the heating treatment to obtain the results shown in Table 3.

Table 3

|  | Pretreatment by Corona Discharge | Results of Peel Test before Heating | Results of Peel Test after Heating |
|---|---|---|---|
| Example 1 | No | 65 | 100 |
|  | Pretreated | 80 | 100 |
| Example 2 | No | 70 | 100 |
| Example 3 | No | 60 | 100 |
| Comparative Example 1 | No | 0 | 0 |
|  | Pretreated | 25 | 25 |

As is apparent from the foregoing Examples and Table 3, a much higher peel strength can be obtained by the use of an acid- or acid anhydride-modified polypropylene than in the case of carrying out a pretreatment by corona discharge well known in the art and a metallic film having a peel strength sufficient to resist practical uses without overcoating the vapor deposited surface can be obtained by the heating treatment according to the invention. Moreover, the heating treatment has no effect on a metallic layer obtained by carrying out the conventional pretreatment of a polyolefin.

What is claimed is:

1. A method of forming a metallic layer on the surface of a polyolefin which comprises vapor depositing in a vacuum a metallic layer on a polyolefin article modified by 0.002 to 3 mole percent of one or more unsaturated fatty acids or their functional derivatives and then subjecting the composite article so formed to a heat treatment at a temperature 5° C. to 70° C. lower than the melting point of the polyolefin.

2. The method according to claim 1 wherein the temperature of the heat treatment is 10° C to 50° C lower than the melting point of the polyolefin.

3. The method according to claim 1 wherein the time of the heat treatment is from about 10 seconds to about 1 hour.

4. The method according to claim 1 wherein the time of the heat treatment is about 2 minutes and the temperature is about 150° C.

5. The method according to claim 1 wherein the time of the heat treatment is about 10 minutes and the temperature is about 140° C.

6. The method according to claim 1 wherein the time of the heat treatment is about 1 hour and the temperature is about 100° C.

7. A composite article comprising a metallic layer on a polyolefin film made by the process of claim 1.

8. The method according to claim 1 wherein the temperature of the heat treatment is 92° to 157° C.

9. The method according to claim 4 wherein the polyolefin is a modified isotactic polypropylene and the temperature of the heat treatment is 112° to 152° C.

10. A composite article comprising a metallic layer on a polyolefin film made by the process of claim 5.

11. A composite article according to claim 10 wherein the metallic layer is aluminum.

12. A method of forming a metallic layer on the surface of a polyolefin which comprises vapor depositing in a vacuum forming a metallic layer on a polyolefin article modified by 0.002 to 3 mole percent of one or more unsaturated fatty acids or their functional derivatives and then subjecting the composite article so formed to a heat treatment at a temperature 5° C. to 70° C. lower than the melting point of the polyolefin wherein the modified polyolefin is selected from the group consisting of modified polyethylene and modified polypropylene 13. A method according to claim 12 wherein the metallic layer is selected from the group consisting of aluminum, silver, gold or copper.

14. The method according to claim 13 wherein the temperature of the heat treatment is 10° C to 50° C lower than the melting point of the polyolefin.

15. The method according to claim 13 wherein the temperature of the heat treatment is 92° to 157° C.

16. The method according to claim 13 wherein the polyolefin is modified isotactic polypropylene and the temperature of the heat treatment is 112° to 152° C.

17. The method according to claim 13 wherein the time of the heat treatment is from about 10 seconds to about 1 hour.

18. The method according to claim 13 wherein the time of the heat treatment is about 2 minutes and the temperature is about 150° C.

19. The method according to claim 13 wherein the time of the heat treatment is about 10 minutes and the temperature is about 140° C.

20. The method according to claim 13 wherein the time of the heat treatment is about 1 hour and the temperature is about 100° C.

21. A composite article comprising a metallic layer on a polyolefin film made by the process of claim 14.

* * * * *